US009585274B2

(12) United States Patent
Mitsui

(10) Patent No.: US 9,585,274 B2
(45) Date of Patent: Feb. 28, 2017

(54) ELECTRONIC DEVICE

(71) Applicant: MITSUBISHI STEEL MFG. CO., LTD., Tokyo (JP)

(72) Inventor: Yasuhiro Mitsui, Chiba (JP)

(73) Assignee: MITSUBISHI STEEL MFG. CO., LTD., Tokyo (JP)

( * ) Notice: Subject to any disclaimer, the term of this patent is extended or adjusted under 35 U.S.C. 154(b) by 77 days.

(21) Appl. No.: 14/765,866

(22) PCT Filed: Mar. 11, 2015

(86) PCT No.: PCT/JP2015/057167
§ 371 (c)(1),
(2) Date: Aug. 5, 2015

(87) PCT Pub. No.: WO2015/166720
PCT Pub. Date: Nov. 5, 2015

(65) Prior Publication Data
US 2016/0270246 A1     Sep. 15, 2016

(30) Foreign Application Priority Data

Apr. 28, 2014   (JP) ................................ 2014-092893

(51) Int. Cl.
*H04M 1/02*     (2006.01)
*H05K 5/03*     (2006.01)
(Continued)

(52) U.S. Cl.
CPC .............. *H05K 5/03* (2013.01); *F16C 11/045* (2013.01); *F16C 11/10* (2013.01); *H04M 1/02* (2013.01);
(Continued)

(58) Field of Classification Search
None
See application file for complete search history.

(56) References Cited

U.S. PATENT DOCUMENTS 9,413,971 B2 *   8/2016   Mitsui .................. H05K 5/0017
2012/0081593 A1 *  4/2012  Nakagawa ............. G03B 13/04
348/333.06
(Continued)

FOREIGN PATENT DOCUMENTS

JP   2000-236465   8/2000
JP   2006-138959   6/2006
(Continued)

OTHER PUBLICATIONS

International Search Report mailed on May 12, 2015.

*Primary Examiner* — Xanthia C Cunningham
(74) *Attorney, Agent, or Firm* — IPUSA, PLLC

(57) ABSTRACT

The present invention is an electronic device including a first housing, a second housing, and an opening and closing device for opening and closing the second housing with respect to the first housing between a closed position and an opened position, wherein the opening and closing device includes a stand that is disposed in the first housing; a base plate that is pivotably borne by the stand; a movable plate that is disposed in the second housing and that is movably disposed in the base plate, wherein the movable plate is configured to move between a first position where the movable plate overlaps with the base plate and a second position where the movable plate protrudes from the base plate; a bias unit configured to bias the movable plate to the base plate in the protruding direction; a movement restriction system that is formed of a first member and a second member, wherein during a state in which the base plate is at the closed position, the movement restriction system is configured to restrict, by locking between the first member and the second member, movement of the base plate with respect to the stand and movement of the movable plate with respect to the base plate; and a movement bias system configured to bias, during movement of the base plate from
(Continued)

the opened position to the closed position, the movable plate to move from the second position toward the first position in accordance with the movement, wherein the first member is integrally formed with one of the first housing and the second housing.

6 Claims, 9 Drawing Sheets

(51) Int. Cl.
    *H04N 5/225*     (2006.01)
    *H04N 5/232*     (2006.01)
    *H05K 5/00*     (2006.01)
    *H05K 5/02*     (2006.01)
    *F16C 11/04*     (2006.01)
    *F16C 11/10*     (2006.01)

(52) U.S. Cl.
    CPC ............ *H04N 5/225* (2013.01); *H04N 5/2252* (2013.01); *H04N 5/23293* (2013.01); *H05K 5/0017* (2013.01); *H05K 5/0217* (2013.01); *H05K 5/0226* (2013.01); *H04M 1/0216* (2013.01); *H04M 1/0237* (2013.01); *H04M 1/0266* (2013.01)

(56) References Cited

U.S. PATENT DOCUMENTS

| | | | |
|---|---|---|---|
| 2013/0093946 A1* | 4/2013 | Nakagawa | H04N 5/2252 348/374 |
| 2014/0055657 A1 | 2/2014 | Koda | |
| 2014/0253777 A1* | 9/2014 | Yamaura | H04N 5/2252 348/333.06 |
| 2016/0066451 A1* | 3/2016 | Mitsui | H05K 5/0221 348/333.06 |

FOREIGN PATENT DOCUMENTS

| | | |
|---|---|---|
| JP | 2009-017421 | 1/2009 |
| JP | 2013-207389 | 10/2013 |
| JP | 2014-045314 | 3/2014 |
| JP | 2014-078295 | 5/2014 |

* cited by examiner

ELECTRONIC DEVICE

TECHNICAL FIELD

The present invention relates to an electronic device, and relates to an electronic device having an opening and closing device that is used for opening and closing first and second housings.

BACKGROUND ART

Digital cameras, camcorders and mobile phones are known in the art as electronic devices that are configured such that a liquid crystal display or the like is embedded into a device main body to confirm captured images. Further, an electronic device is provided that has a configuration in which a display unit is movable with respect to the device main body, so that the liquid crystal display can be viewed from various angles.

In this type of electronic device, the display unit can be accommodated in a rear surface of the device main body during a normal state, and the configuration is such that the liquid crystal display of the display unit can be viewed in this accommodated state. However, the liquid crystal display may not be viewed in a state in which the display unit is accommodated, depending on a photographing condition, such as a photographing position. In such a case, the display unit is moved from the device main body, and thereby the configuration allows the display unit to be viewed even in the above-described photographing condition.

Recently, taking a self portrait photograph by using an electronic device, such as a digital camera, is becoming popular (so called "selfie"). In such a case, in a state in which the display unit is accommodated in the rear surface of the device main body, a photographer who is located in front of the device main body may not view the liquid crystal display. For this reason, an electronic device is provided that has a configuration such that, when a photographer is located in front of the device main body, the display unit can be moved to a position at which the liquid crystal display can be viewed (Patent Document 1).

[Patent Document 1] Japanese Unexamined Patent Publication No. 2006-138959

DISCLOSURE OF THE INVENTION

Problems to be Solved by the Invention

The display unit that includes the liquid crystal display has, however, a relatively large thickness. Thus, with a configuration in which the display unit is pivoted around a rotational shaft with respect to the device main body, a corner portion of the display unit that is disposed at a side that is closer to the rotational axis and a corner portion of the device main body that is disposed at a side that is closer to the rotational axis come into contact with each other with the rotation.

Means for Solving Problems

An overall object of the present invention is to provide an improved and useful electronic device for solving the above-described problem with the related art.

A more detailed object of the present invention is to provide an electronic device such that a first housing and a second housing can be stably opened and closed.

To achieve this object, the present invention is an electronic device having a first housing; a second housing; and an opening and closing device for opening and closing the second housing between a closed position and an opened position with respect to the first housing. The opening and closing device includes a stand that is disposed in the first housing; a base plate that is pivotably borne by the stand; a movable plate that is disposed in the second housing and that is movably disposed in the base plate, wherein the movable plate is configured to move between a first position where the movable plate overlaps with the base plate and a second position where the movable plate protrudes from the base plate; a bias unit configured to bias the movable plate to the base plate in the protruding direction; a movement restriction system that is formed of a first member and a second member, wherein during a state in which the base plate is at the closed position, the movement restriction system is configured to restrict, by locking between the first member and the second member, movement of the base plate with respect to the stand and movement of the movable plate with respect to the base plate; and a movement bias system configured to bias, during movement of the base plate from the opened position to the closed position, the movable plate to move from the second position toward the first position in accordance with the movement. The first member is integrally formed with one of the first housing and the second housing.

Effect of the Invention

According to the present invention, an opening and closing process of an electronic device that includes an opening and closing device can be stably executed.

MODE FOR CARRYING OUT THE INVENTION

Figure 1:
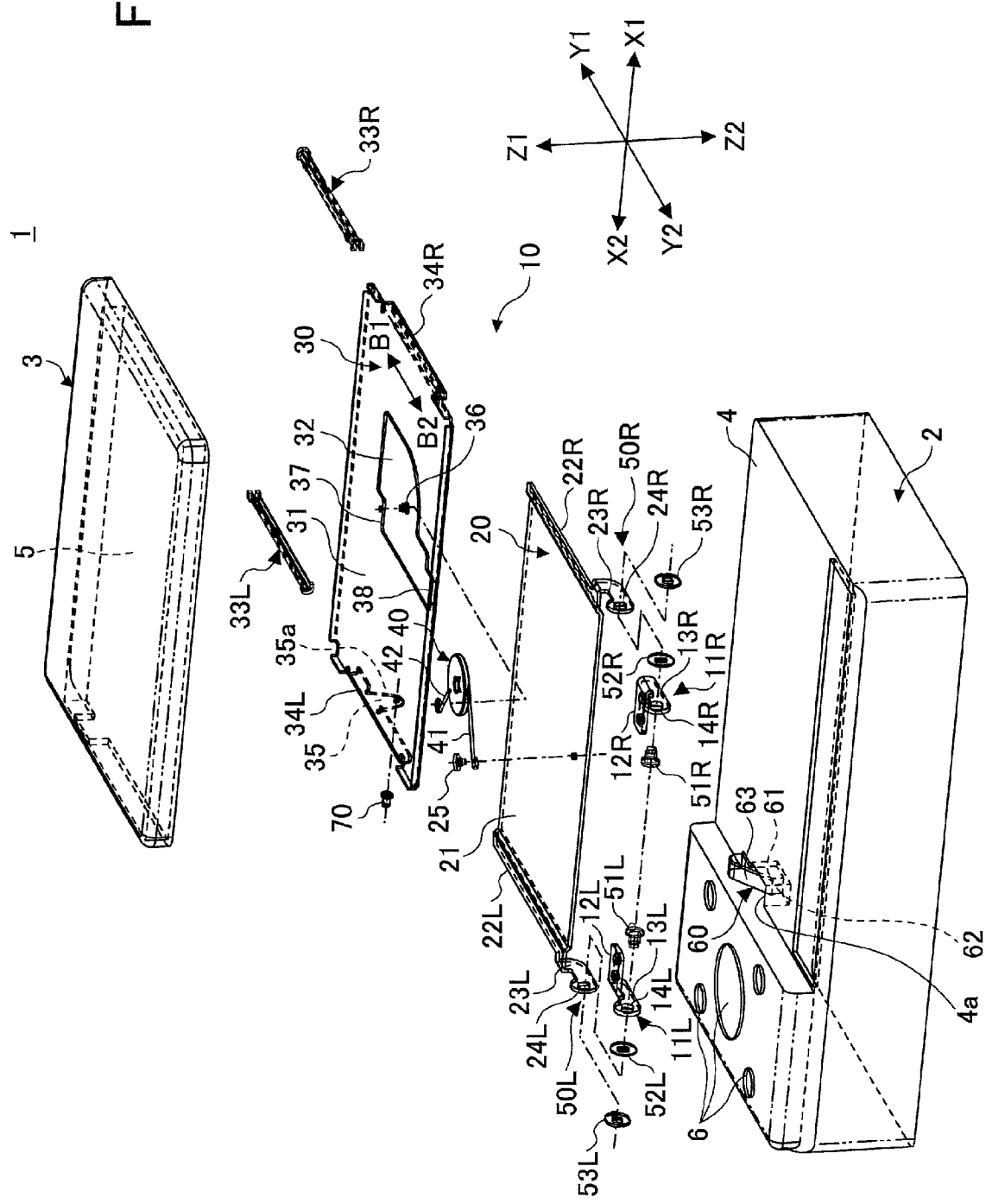
FIG. 1 is an exploded perspective view of an electronic device according to an embodiment of the present invention.

Next, a non-limiting exemplary embodiment of the present invention is explained by referring to the accompanying drawings.

Note that, in all the accompanying drawings, the same or corresponding reference numerals are attached to the same or corresponding members or components, and thereby duplicate explanations are omitted. Further, the drawings are not intended to show relative ratios between members or components, except as indicated otherwise. Accordingly, specific dimensions can be determined by a person ordinarily skilled in the art in light of the following non-limiting embodiment.

Further, the embodiment explained below is an example, and does not limit the invention. All the features that are described in the embodiment and their combinations may not be essential to the present invention.

Figure 2:
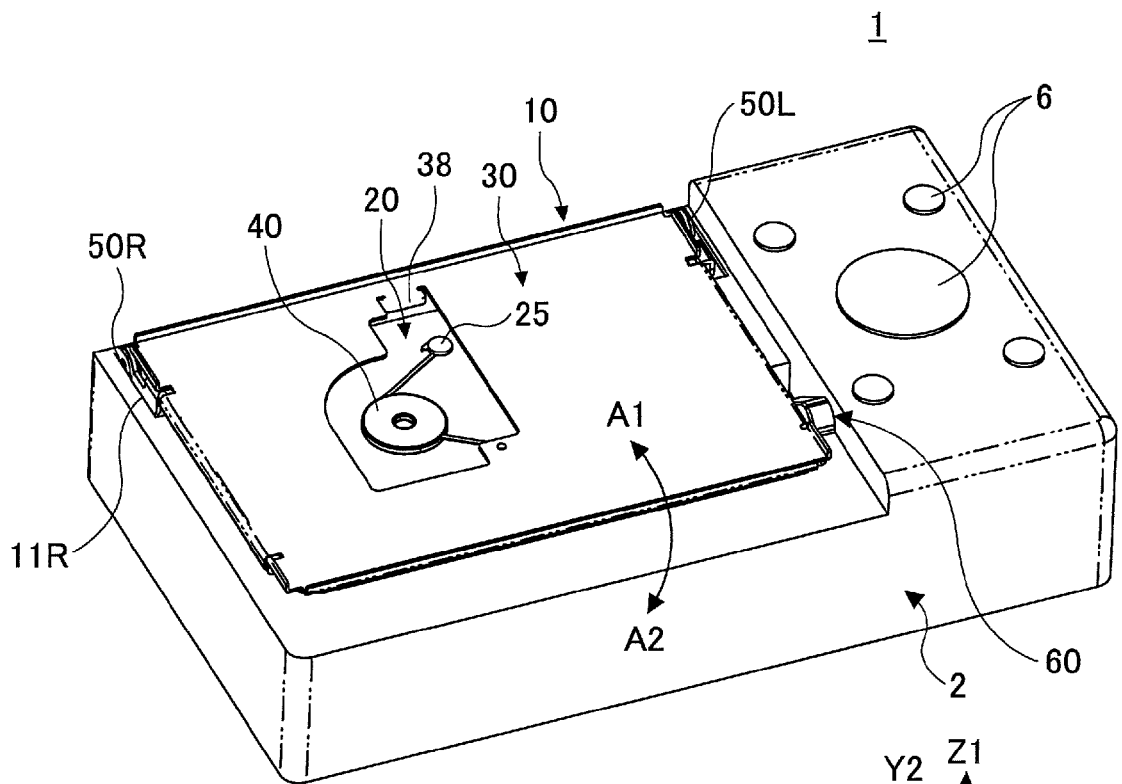
FIG. 2 is a perspective view showing a closed state of the electronic device according to the embodiment of the present invention.
Figure 2:
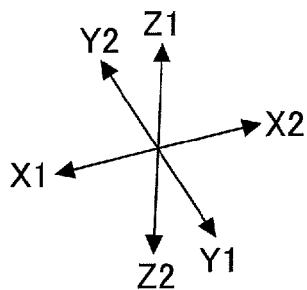

FIGS. 1 and 2 are diagrams illustrating an electronic device 1 according to an embodiment of the present invention. FIG. 1 is an exploded perspective view of the electronic device 1. FIG. 2 is a perspective view of the electronic device 1 in a state in which a display unit 3 is removed. In this embodiment, the electronic device 1 is explained by taking a digital camera as an example. However, the application of the present invention is not limited to the digital camera. The present invention can be broadly applied to an electronic device, such as a camcorder or a mobile phone, that has a movable portion (e.g., a display unit 3) with respect to a device main body 2.

The electronic device 1 includes the device main body 2; the display unit 3; and an opening and closing device 10 that supports the display device 3, so that the display device 3 can be opened and closed (pivoted) with respect to the device main body 2.

The device main body 2 is formed by resin molding. The device main body 2 has a switch or the like on its rear surface side, and the display unit 3 is attached to the device main body 2. Further, an image capturing lens or the like (not shown) for taking a photograph is provided at a front side of the device main body 2. Furthermore, various types of electronic components are provided inside the device main body 2 that are for executing an image capturing process.

The display unit 3 is formed by resin molding, and the display unit 3 has a configuration such that a liquid crystal display 5 is integrally embedded. An image that is captured through the image capturing lens is displayed on the liquid crystal display 5 that is provided on the display unit 3. Thus, a photographer can confirm, through the liquid crystal display 5, an image that is to be captured.

The display unit 3 can be accommodated inside a display unit accommodating portion 4 of the device main body 2 during taking a general photograph. Note that a state in which the display unit 3 is accommodated inside the display unit accommodating portion 4 is referred to as a "closed state" in the explanation below.

Recently, taking a self portrait photograph by an electronic device (so called "selfie"), is becoming popular, and the electronic device 1 has a configuration corresponding to this. Specifically, the display unit 3 has a configuration such that it can be moved (rotated) with respect to the device main body 2 in the directions of A1 and A2 in the figure by the opening and closing device 10.

Figure 4A:
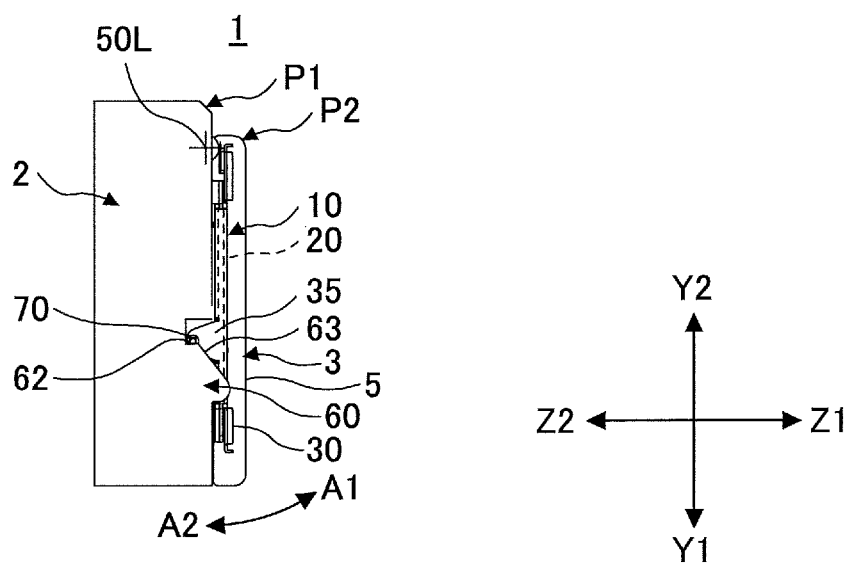
FIG. 4A is a side view (version 1) illustrating an operation of the electronic device according to the embodiment of the present invention.
Figure 4B:
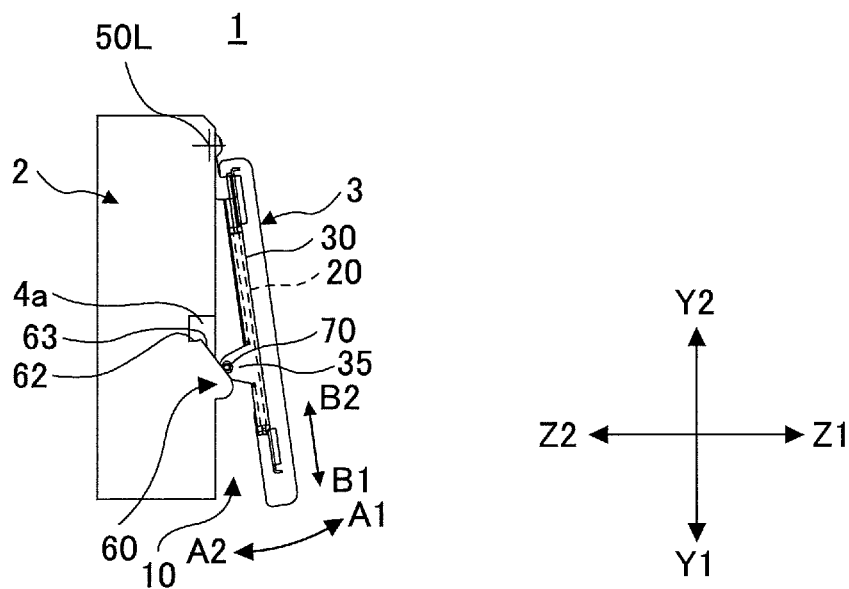
FIG. 4B is a side view (version 2) illustrating the operation of the electronic device according to the embodiment of the present invention.
Figure 4C:
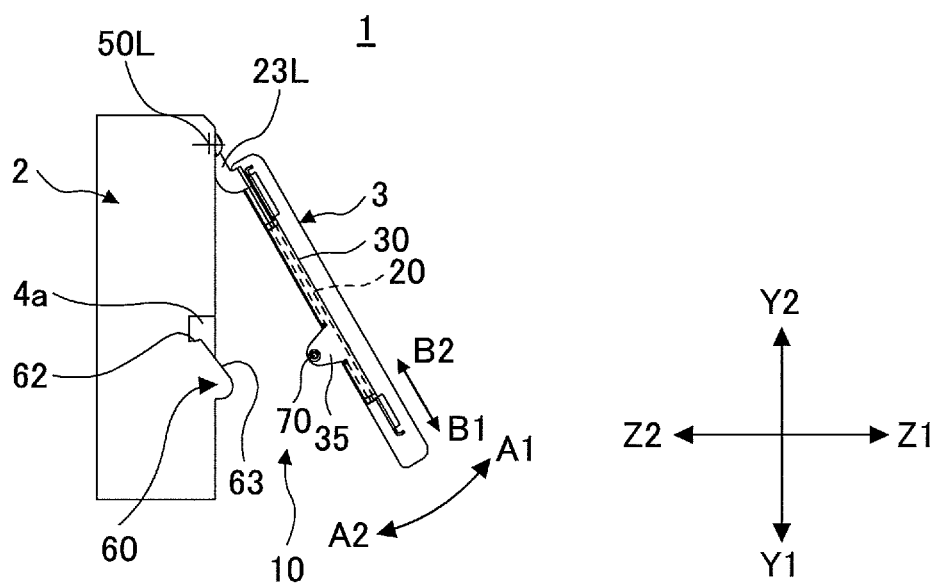
FIG. 4C is a side view (version 3) illustrating the operation of the electronic device according to the embodiment of the present invention.
Figure 4D:
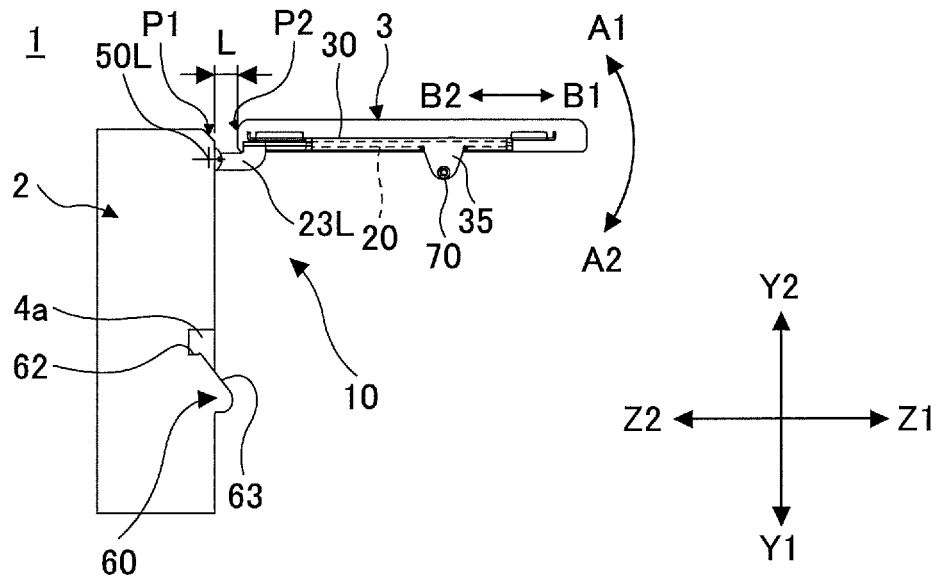
FIG. 4D is a side view (version 4) illustrating the operation of the electronic device according to the embodiment of the present invention.
Figure 4E:
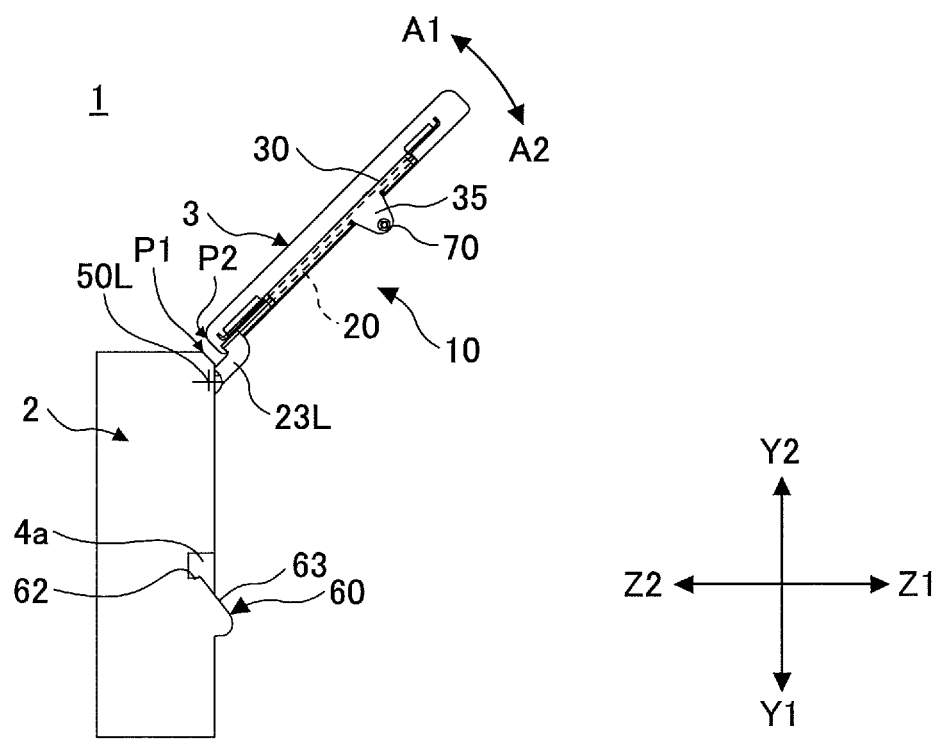
FIG. 4E is a side view (version 5) illustrating the operation of the electronic device according to the embodiment of the present invention.
Figure 4F:
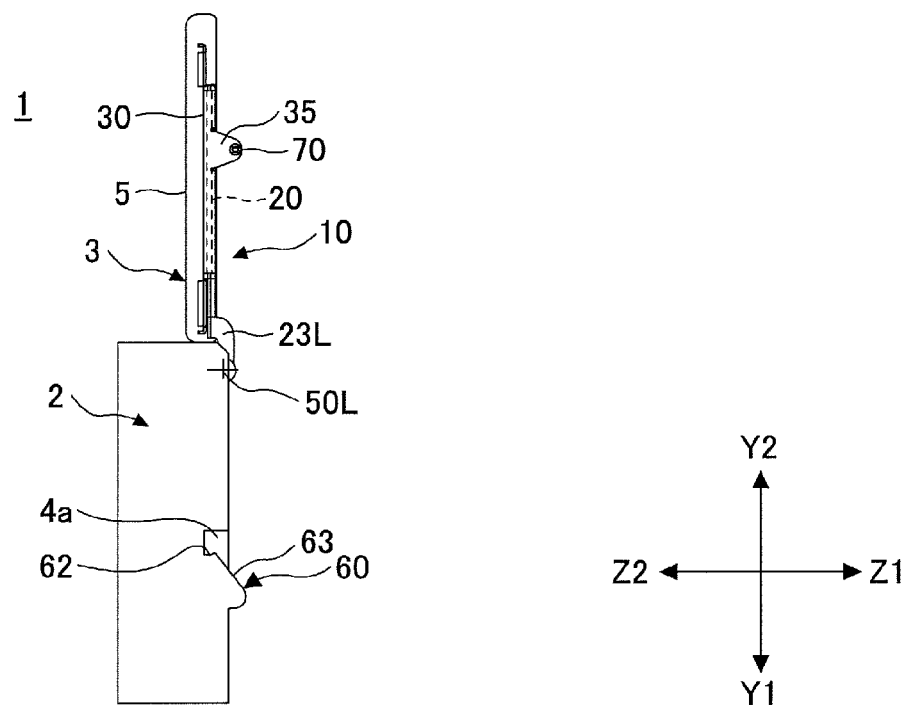
FIG. 4F is a side view (version 6) illustrating the operation of the electronic device according to the embodiment of the present invention.

FIG. 4F shows a state in which the display unit 3 is opened with respect to the device main body 2. Note that a state in which the display unit 3 is opened is referred to as an "opened state" in the explanation below.

This opened state is a state in which both the image capturing lens that is provided in the device main body 2 and the liquid crystal display 5 are arranged at a front surface side. Thus, for taking so-called "selfie," a photographer can take a photograph while confirming himself/herself by the liquid crystal display 5.

Next, there is explained a configuration of the opening and closing device 10 that is provided in the electronic device 1.

The opening and closing device 10 includes stands 11L and 11R; a base plate 20; a slide plate 30; a spring 40; hinge systems 50L and 50R; a cam portion 60; an locking pin 70; and so forth.

Note that, in each of the figures that is used for the explanation, for elements that are symmetrically arranged in the left and right directions (the X1 and X2 directions in the figure), a symbol "R" is attached to an element that is located at a right side (the side in the X1 direction), and a symbol "L" is attached to an element that is located at a left side (the side in the X2 direction).

The stands 11L and 11R are formed of metal plates by press forming. The stands 11L and 11R have configurations such that fastening portions 12L and 12R and upright portions 13L and 13R are integrally formed, respectively. The fastening portions 12L and 12R are fastened to the device main body 2. Further, at the end portions of the upright portions 13L and 13R, shaft holes 14L and 14R are formed to which hinge pins 51L and 51R are to be installed, which are described below.

The base plate 20 is formed of a metal plate by press forming. The base plate 20 has a configuration such that a base main portion 21; guide rail members 22L and 22R; arm members 23L and 23R; and so forth are integrally formed. The base main portion 21 has a substantially rectangular shape, and the guide rail members 22L and 22R are formed at both side edges of the short sides.

Further, the arm members 23L and 23R are formed at the end portions of both sides of the base main portion 21 in the Y2 direction. The arm members 23L and 23R have L-shapes when they are viewed from the side direction, one end portions are integrally connected with the base main portion 21, and shaft holes 24L and 24R are formed at the other end portions into which the hinge pins 51L and 51R are to be inserted, respectively.

Further, a spring 40 is provided at a substantially center portion of the base main portion 21. The type of the spring 40 is not particularly limited, provided that the spring 40 can apply elastic force between the base plate 20 and the slide plate 30. In the embodiment, a torsion spring is used.

One arm portion 41 of this spring 40 is fixed to the base main portion 21 by a spring pin 25. Further, the other arm portion 42 of the spring 40 is fixed to the slide plate 30 by fixing a spring pin 36 to a pin fixing hole 37. Thus, a configuration is obtained such that the spring 40 is disposed between the base plate 20 and the slide plate 30.

The slide plate 30 is formed of a metal plate by press forming. The slide plate 30 includes a slide main portion 31; an opening 32; guide fixing portions 34L and 34R; a pin fixing portion 35; a contact portion 38; and so forth.

This slide plate 30 is fixed to the display unit 3 of the electronic device 1. Thus, the display unit 3 moves together with the side plate 30.

The slide main portion 31 has a substantially rectangular shape, and the opening 32 is formed approximately at its center portion. The position where the opening 32 is formed corresponds to the position where the spring 40 is disposed. Further, at the end portion of the opening 32 at the side of the direction that is indicated by the arrow B2 in the figure, the contact portion 38 is formed that functions as a stopper of the slide plate 30.

The guide fixing portions 34L and 34R are integrally formed at the both side edges of the slide main portion 31. The guide fixing portions 34L and 34R are formed by bending the both side edges of the slide main portion 31 in substantially U-shapes, respectively. Slide guides 33L and 33R are to be fixed to the guide fixing portions 34L and 34R, respectively.

The slide guides 33L and 33R are resin molded products that are formed of a resin having high durability and high slippage. Further, at inside positions of the slide guides 33L and 33R, grooves are formed that extend in the Y1, Y2 directions in FIG. 1, respectively. The slide guides 33L and 33R are to be fixed to the guide fixing portions 34L and 34R, respectively.

Note that this fixing method is not particularly limited. They can be locked by providing locking members, they can be fixed by using an adhesive, or they can be integrally formed during a press process of the slide plate 30.

Further, the pin fixing portion 35 is integrally formed at one of the short sides of the slide main portion 31 (the short side in the direction of the arrow X2 in the figure). The pin fixing portion 35 is formed by downward extension from one edge portion at the short side of the slide main portion 31.

A locking pin 70 is fixed to the pin fixing portion 35. Thus, the locking pin 70 moves together with movement of the slide plate 30 (the display unit 3). The locking pin 70 has a configuration such that it protrudes toward outside from the pin fixing portion 35 (in the direction of the arrow X2).

The hinge systems 50L and 50R are for pivotably connecting the stands 11L and 11R with the base plate 20. The hinge systems 50L and 50R include the hinge pins 51L and 51R; spacers 52L and 52R; click plates 53L and 53R, and so forth, respectively.

Next, a cam portion 60 is explained.

In the embodiment, the cam portion 60 is integrally formed with the device main body 2. The position on the device main body 2 where the cam portion 60 is formed is arranged on a trajectory of the locking pin 70 that moves with movement of the display unit 3 and the slide plate 30. Specifically, the cam portion 60 is formed at one edge portion of the display unit accommodating portion 4 in the direction of the arrow X2 in the figure (cf. FIG. 1).

The cam portion 60 has a configuration such that a locking recess 62 and a tilted surface 63 are formed in a cam main portion 61 that has a substantially triangular shape.

The locking recess 62 is a position where the locking pin 70 is locked, and the locking recess 62 is formed at one vertical angle of the cam main portion 61. The locking recess 62 is formed so that it is located at a bottom portion of a recess 4a that is formed in the display unit accommodating portion 4 of the device main body 2.

The depth of the recess 4a is set based on a clearance S (which is indicated by the arrows in FIG. 3A) between an inner surface of the display unit 3 and the locking pin 70. Namely, the clearance S is set so that the locking pin 70 and the locking recess 62 are locked during a state in which the display unit 3 is at a closed position.

Further, the locking recess 62 is formed at an end portion of the cam main portion 61 that is closer to the hinge systems 50L and 50R (the side in the direction of the arrow Y2 in the figure).

The tilted surface 63 is a tilted surface that is formed on a top surface of the cam main portion 61. The tilted surface 63 is a tilted surface such that the height of the cam main portion 61 in the directions of the arrows Z1 and Z2 is gradually decreased along the direction of the arrow Y2 in the figure.

Next, there is explained a method of assembling the electronic device 1.

To assemble the electronic device 1, first the opening and closing device 10 is to be assembled. For assembling the opening and closing device 10, the stands 11L and 11R are connected to the base plate 20.

The connection of the stand 11L and 11R to the base plate 20 is made by using the hinge systems 50L and 50R. In order to connect the stands 11L and 11R to the base plate 20 by using the hinge systems 50L and 50R, first, the spacer 52L is disposed between the arm member 23L and the stand 11L, and the spacer 52R is disposed between the arm member 23R and the stand 11R. Then, in this state, axis alignment (position alignment) is executed among the shaft holes 14L and 14R of the stands 11L and 11R and the shaft holes 24L and 24R of the arm members 23L and 23R.

After completing the position alignment, the hinge pin 51L is inserted into the shaft hole 24L, the spacer 52L, and the shaft hole 14L from inside to outside, and the hinge pin 51R is inserted into the shaft hole 24R, the spacer 52R, and the shaft hole 14R from inside to outside. Then, the click plate 53L is fixed to a tip portion of the hinge pin 51L that protrudes outside from the shaft hole 14L, and the click plate 53R is fixed to a tip portion of the hinge pin 51R that protrudes outside from the shaft hole 14R.

By doing this, a configuration is obtained in which the base plate 20 is pivotably borne by the stands 11L and 11R through the hinge systems 50L and 50R. Further, the hinge systems 50L and 50R are so-called "free stop hinges," so that the base plate 20 can be supported at any rotational angle with respect to the stands 11L and 11R.

Note that the hinge systems 50L and 50R may not be the free stop hinges. For example, the hinge systems 50L and 50R may have configurations such that click feelings are generated at the opened position, at the closed position, and at predetermined angles from the opened position to the closed position by forming grooves or the like to the stands 11L and 11R.

Next, the slide plate 30 is to be prepared. Note that the preparation of the slide plate 30 may be made in parallel to the above-described process of disposing the stands 11L and 11R to the base plate 20.

In order to prepare the slide plate 30, the slide guides 33L and 33R are fixed to the guide fixing portions 34L and 34R, respectively. Subsequently, the spring 40 is positioned inside the opening 32, and one arm portion 42 of the spring 40 is fixed to the slide plate 30 by using the spring pin 36. The pin fixing hole 37 is already formed in the slide plate 30. By fitting the spring pin 36 into the pin fixing hole 37, the arm portion 42 of the spring 40 is fixed to the slide plate 30.

After the preparation of the slide plate 30 is completed as described above, subsequently the guide rail members 22L and 22R are inserted into the slide guides 33L and 33R, respectively. The guide rail members 22L and 22R and the slide guides 33L and 33R are slidably arranged. Consequently, the slide plate 30 is slidably arranged with respect to the base plate 20.

Further, during disposing the slide plate 30 to the base plate 20, the other arm portion 41 of the spring 40 is fixed to the base plate 20 by using the spring pin 25. In this manner, the spring 40 is disposed between the base plate 20 and the slide plate 30, and the spring 40 applies elastic force between the base plate 20 and the slide plate 30.

The spring 40 applies the elastic force so that the slide plate 30 is directed toward outside (the direction of the arrow B1) with respect to the base plate 20. By the elastic force of the spring 40, the slide plate 30 tends to slide in the B1 direction with respect to the base plate 20.

However, by contact of the contact portion 38 that is formed in the slide plate 30 with the spring pin 25 that is fixed to the base plate 20, further slide of the slide plate 30 is restricted.

After completion of the assembly of the opening and closing device 10 as described above, the device main body 2 and the display unit 3 are to be assembled to the opening and closing device 10. Namely, fastening portions 12L and 12R of the stands 11L and 11R are fastened to the device main body 2, and concurrently the display unit 3 is fixed to the base plate 20. In this manner, the assembly of the electronic device 1 is completed.

In this embodiment, the cam portion 60 is integrally formed with the device main body 2. The cam portion 60 can be concurrently formed during resin molding of the device main body 2 because the device main body 2 is a resin molded product. Thus, according to the embodiment, reduction of the number of components, reduction of the number of assembly steps, and cost reduction can be achieved, compared to a configuration in which the cam portion 60 and the device main body 2 are formed as separate components.

In the above-described assembling method, a method is shown in which the slide plate 30 is attached to the base plate 20, after attaching the base plate 20 to the stands 11L and 11R. However, after attaching the slide plate 30 to the base plate 20, the base plate 20 can be attached to the stands 11L and 11R.

Next, there is explained operation of the electronic device 1 and the opening and closing device 10 having above-described configurations by using FIGS. 3A-3E, 4A-4F, 5A, and 5B.

Figure 5A:
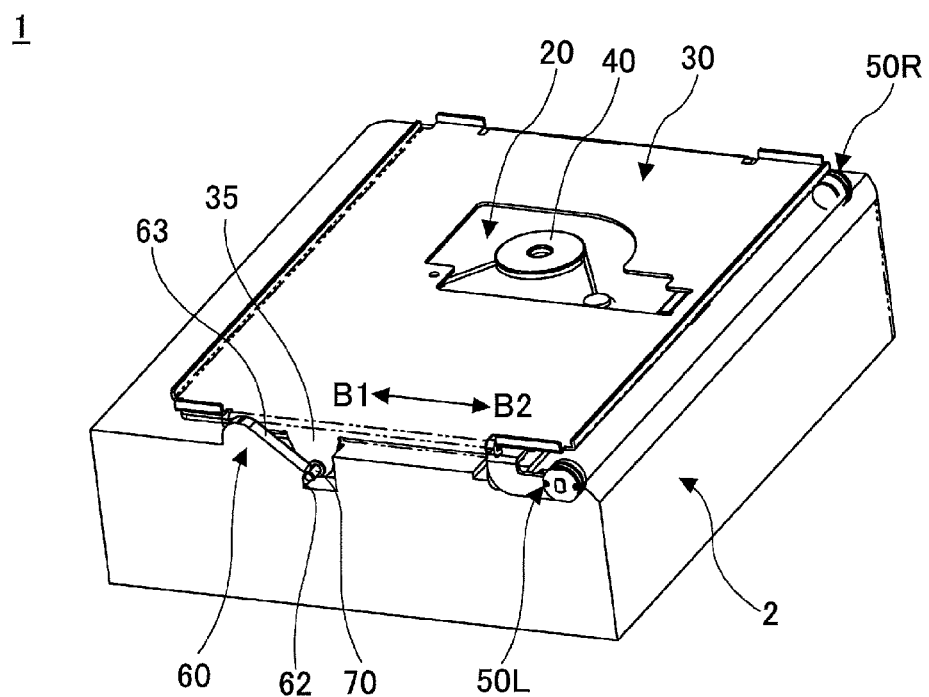
FIG. 5A is a perspective view showing a state in which a locking pin and a cam portion are locked.
Figure 5B:
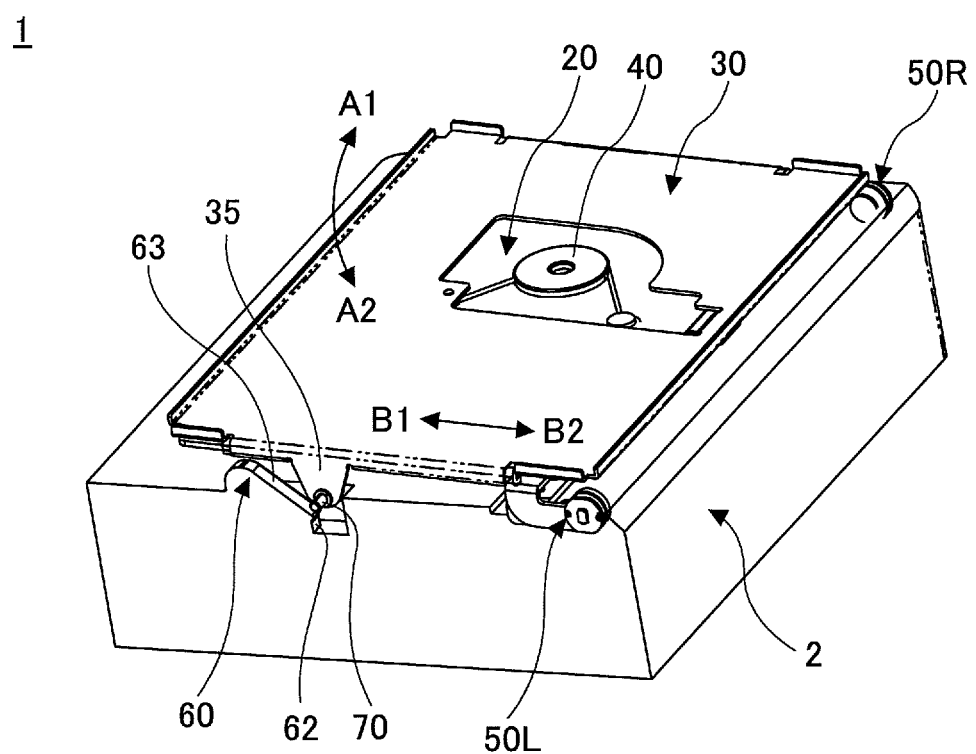
FIG. 5B is a perspective view showing a state in which the locking pin and the cam portion are released.

FIGS. 3A-3E are side views showing the operation of the opening and closing device 10. FIGS. 4A-4F are side views showing the operation of the electronic device 1 in which the opening and closing device 10 is provided. FIGS. 5A and 5B are perspective views showing the enlarged vicinity of the cam portion 60.

Note that, in FIGS. 3A-3E, 4A-4F, 5A and 5B, the shape of the device main body 2 is depicted to be partially different from the shape that is shown in FIGS. 1 and 2, so that the shape of the cam portion 60 can be easily viewed. However, they are substantially the same.

Figure 3A:
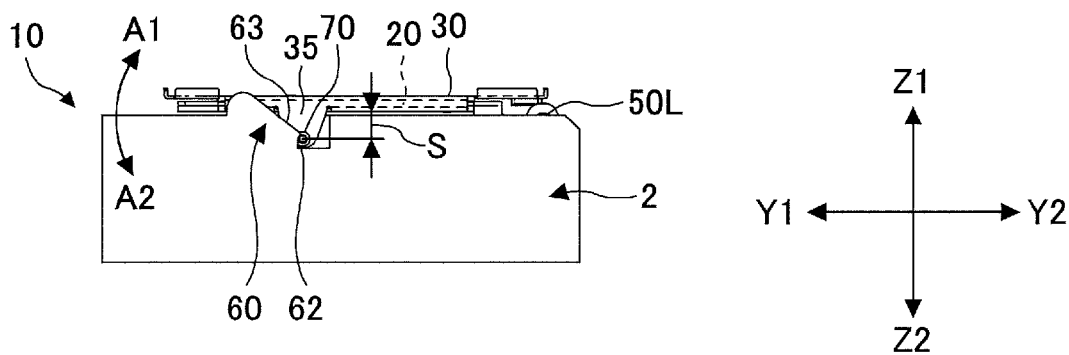
FIG. 3A is a side view (version 1) illustrating an operation of an opening and closing device that is disposed inside the electronic device according to the embodiment of the present invention.

FIGS. 3A, 4A, and 5A show the closed state in which the display unit 3 and the base plate 20 are closed. At this time, the display unit 3 is in a state such that the display unit 3 is accommodated in the display unit accommodating portion 4 of the device main body 2.

Further, in the closed state, the slide plate 30 is slid in the direction of the arrow B2 in the figure against the elastic force of the spring 40. The outer shapes of the base plate 20 and the slide plate 30 are substantially the same shapes in plan view (when viewed from above).

Thus, by sliding the slide plate 30 in the direction of B2 in the closed state, the slide plate 30 is in a state in which the slide plate 30 overlaps with the base plate 20. Note that, in the explanation below, the position of the slide plate 30 in the closed state is referred to as a "first position."

Further, as enlarged and shown in FIG. 5A, the locking recess 62 that is formed in the cam portion 60 has a configuration such that it is locked to the locking pin 70 that is formed at the pin fixing portion 35 in the closed state.

Thus, even if the slide plate 30 is biased in the direction of B1 by the elastic force of the spring 40, movement of the slide plate 30 in the direction of B1 is restricted by contact of the locking pin 70 to the cam portion 60. Note that the locking recess 62 (the cam portion 60) and the locking pin 70 may form a movement restriction system that is described in claims.

The locking recess 62 is a recess whose cross section has a semicircular shape corresponding to the cylindrical shape of the locking pin 70. Thus, in a locked state, locking between the locking recess 62 and the locking pin 70 is ensured. In addition, by the elastic force of the spring 40, the locking pin 70 is pressed toward the locking recess 62 of the cam portion 60. Consequently, even if an impulse is applied from outside in the closed state, the cam portion 60 and the locking pin 70 do not separate. Thus, even if an impulse is applied, the display unit 3 does not move from the device main body 2, thereby enhancing reliability of the electronic device 1.

Figure 3B:
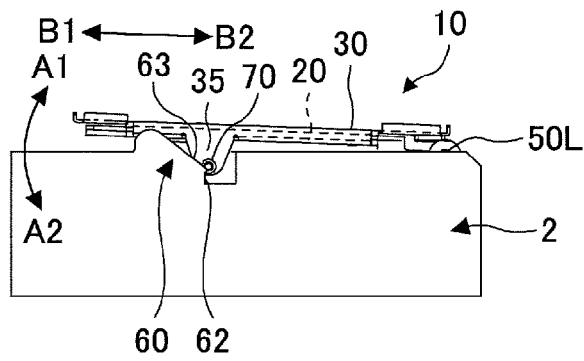
FIG. 3B is a side view (version 2) illustrating the operation of the opening and closing device that is disposed inside the electronic device according to the embodiment of the present invention.
Figure 3B:
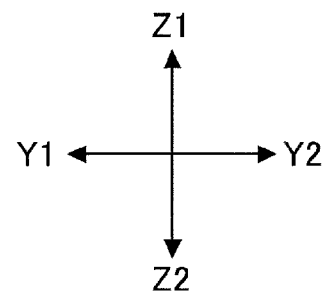

In order to switch the electronic device 1 and the opening and closing device 10 from the above-described closed state to the opened state, the display unit 3 is to be rotated in the direction of A1 with respect to the stands 11L and 11R. FIGS. 3B and 5B show a state immediately after the cam portion 60 is released from the locking pin 70.

During the release, for the locking recess 62 to climb over the locking pin 70, the slide plate 30 moves by a small amount (the amount corresponding to the recess of the locking recess 62) with respect to the base plate 20 in the direction of the arrow B2 in the figure. However, a clearance that corresponds to the amount of the movement is provided in advance between the base plate 20 and the slide guides 33L and 33R, and thereby the above-described movement of the slide plate 30 is allowed.

Figure 3C:
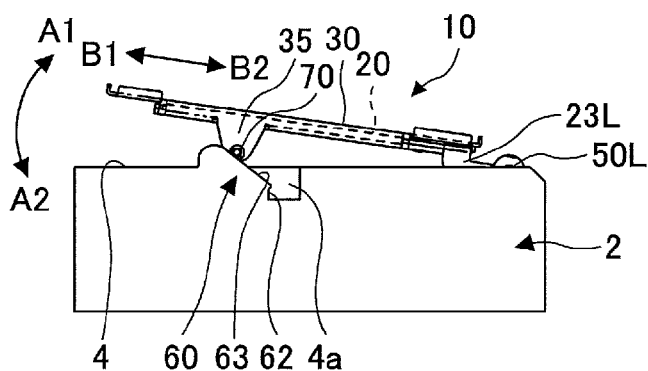
FIG. 3C is a side view (version 3) illustrating the operation of the opening and closing device that is disposed inside the electronic device according to the embodiment of the present invention.
Figure 3C:
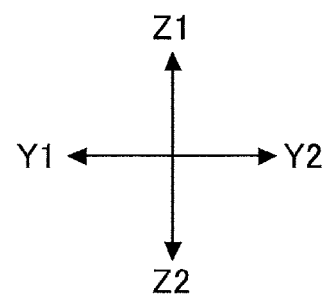

FIGS. 3C and 4B show a state in which the locking pin 70 is completely separated from the locking recess 62 by further rotating the display unit 3 in the direction of A1. By the separation of the locking pin 70 from the locking recess 62, the restriction on movement of the slide plate 30 in the direction of the arrow B1 in the figures is removed.

In this manner, by the release of the lock between the locking recess 62 and the locking pin 70, the display unit 3 and the slide plate 30 slide together with respect to the base plate 20 in the direction of B1. At this time, as shown in FIGS. 3C and 4B, the locking pin 70 relatively moves on the tilted surface 63 of the cam portion 60.

Figure 3D:
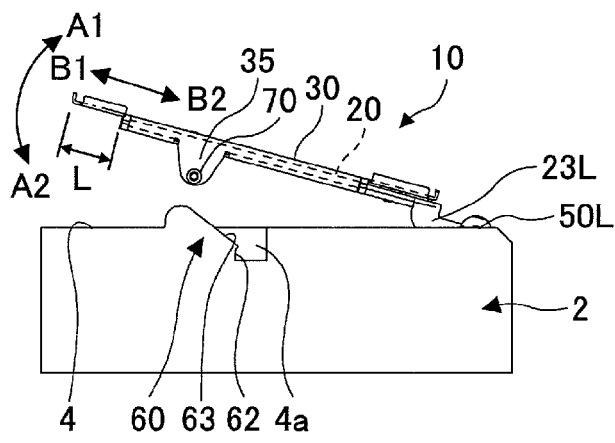
FIG. 3D is a side view (version 4) illustrating the operation of the opening and closing device that is disposed inside the electronic device according to the embodiment of the present invention.
Figure 3D:
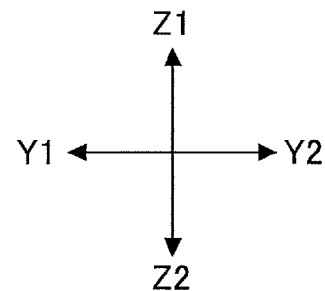
Figure 3E:
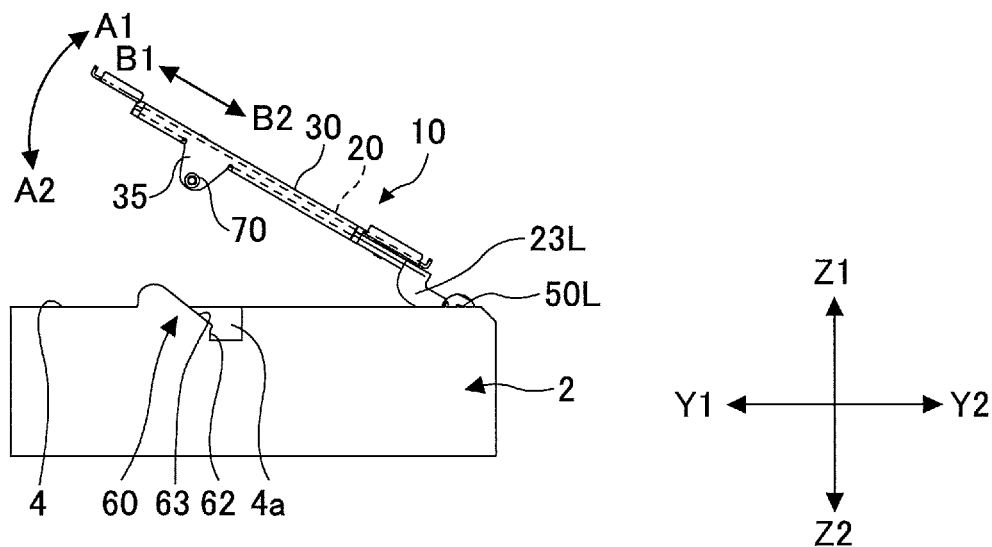
FIG. 3E is a side view (version 5) illustrating the operation of the opening and closing device that is disposed inside the electronic device according to the embodiment of the present invention.

Then, as shown in FIGS. 3D and 4C, in a state in which the locking pin 70 is completely separated from the cam portion 60, the contact portion 38 (cf. FIGS. 1 and 2) that forms a portion of the opening 32 of the slide plate 30 contacts the spring pin 25, thereby restricting the slide of the slide plate 30 with respect to the base plate 20 in the direction of B1. Hereinafter, the limit position of the movement of the slide plate 30 in the direction of B1 is referred to as a "second position."

In the state in which the slide plate 30 is slid to the second position, the slide plate 30 protrudes with respect to the base plate 20 by the length that is indicated by the arrows L in FIG. 3D. Further, the display unit 3 is also slid by the distance L in the direction of the B1 with the slide of the slide plate 30 because the display unit 3 is attached to the slide plate 30.

FIG. 4D shows the electronic device 1 that is in a state in which the cam portion 60 is completely separated from the locking pin 70. In the same figure, focusing on a corner portion P1 of the device main body 2 and a corner portion P2 of the display unit 3, in accordance with the slide of the display unit 3 together with the slide plate 30 with respect to the base plate 20 as described above, the corner portion P2 is also moved by the distance L in the direction of B1 compared to the position of the closed state. Namely, by sliding of the slide plate 30 with respect to the base plate 20, the clearance L between the corner portion P1 of the device main body 2 and the corner portion P2 of the display unit 3 becomes greater compared to that of the closed state.

Upon further rotating the display unit 3 in the direction of A1 from this state, the base plate 20 pivots around the hinge pins 51L and 51R with respect to the stands 11L and 11R, and, in accordance with this, the display unit 3 also rotates with respect to the device main body 2. FIG. 4E shows a state in which the base plate 20 is rotated by approximately 135° relative to the closed position.

After the slide plate 30 slides with respect to the base plate 20 in the direction of the arrow B1 in the figure and the slide plate 30 is moved to the second position, the slide plate 30 rotates in a state in which the second position is maintained. Thus, the rotation is made while maintaining the state in which the corner portion P1 of the device main body 2 and the corner portion P2 of the display unit 3 are separated.

Consequently, the corner portion P2 does not contact the corner portion P1, even if the display unit 3 is rotated with respect to the device main body 2. Therefore, an operation to open the display unit 3 with respect to the device main body 2 can be smoothly performed.

FIG. 4F shows the electronic device 1 in the open state. In this state, the liquid crystal display 5 that is provided in the display unit 3 is directed toward the front side (in the figure, the direction of Z2 is the front side), and thereby the so-called selfie can be performed. Note that, in the explanation below, the position of the display unit 3 (the base plate 20) in the opened state is referred to as the opened position.

Next, there is explained an operation for rotating the display unit 3 from the opened position toward the closed position.

Note that the operation for rotating the display unit 3 from the opened position toward the closed position is an operation that is reverse to the above-described operation for moving the display unit 3 from the closed position toward the opened position. For this reason, for the explanation of the operation of the base plate 20 from the opened position toward the closed position, an explanation is made by using FIGS. 4 and 5 that are used for explaining the operation from the closed state toward the opened state.

For moving the display unit 3 from the opened state that is shown in FIG. 4F to the closed position, the display unit 3 is to be moved in the direction of A1 in the figure. In accordance with this, as shown in FIGS. 4E and 4D, the display unit 3 (the base plate 20) rotates toward the closed position. At this time, the slide plate 30 maintains the second position (the slid position in the direction of the arrow B1), thereby maintaining the state in which the clearance between the corners P1 and P2 is large. Thus, for the case in which the display unit 3 moves from the opened position toward the closed position, the corner portions P1 and P2 do not contact.

Upon rotating the display unit 3 and the base plate 20 by a predetermined amount, the locking pin 70 that is fixed to the slide plate 30 contacts the cam portion 60 that is formed in the device main body 2. FIGS. 3C and 4B show the state immediately after the locking pin 70 contacts the cam portion 60.

Upon further moving the display unit 3 in the direction of the arrow A1 in the figure from the state that is shown in FIGS. 3C and 4B, the locking pin 70 relatively moves on the tilted surface 63 while guided by the tilted surface 63. In this manner, by relatively moving the locking pin 70 on the tilted surface 63, the locking pin 70 is biased to move toward the direction of the arrow B2 in the figure.

Consequently, at this time, the tilted surface 63 functions as a cam for biasing the locking pin 70, and the cam portion 60 biases the display unit 3 (the slide plate 30) to move from the second position toward the first position. Namely, the locking pin 70 and the cam portion 60 (the tilted surface 63) form a movement bias system for biasing the display unit 3 to move from the second position toward the first position.

Upon further moving the display unit 3 in the direction of the arrow A2 in the figure, the locking pin 70 enters inside the recess 4a while guided by the tilted surface 63, and the locking pin 70 is locked to the locking recess 62. In this state, the base plate 20 is rotated to the closed position, the slide plate 30 is slid to the first position, and additionally, the display unit 3 is in a state in which the display unit 3 is accommodated in the display unit accommodating portion 4 of the device main body 2. Namely, by locking the locking pin 70 to the locking recess 62, the electronic device 1 and the opening and closing device 10 become the closed state as shown in FIGS. 1, 3A, 4A, and 5A.

As described above, in the electronic device 1 and the opening and closing device 10 according to the embodiment, upon moving the display unit 3 from the closed position toward the opened position, the display unit 3 is moved in the direction of the arrow A1 in the figure, and locking between the locking recess 62 and the locking pin 70 is released. By doing this, the slide plate 30 automatically slides from the first position to the second position, and, in accordance with this, the display unit 3 moves to a position where the corners P1 and P2 do not contact.

Further, upon moving the display unit 30 from the opened position toward the closed position, by the relative movement of the locking pin 70 on the tilted surface 63 (the cam portion 60), the slide plate 30 automatically slides from the second position to the first position, and, in accordance with this, the display unit 3 also moves to the closed position.

Thus, the display unit 3 and the slide plate 30 can be automatically slid between the first position and the second position by only moving the display unit 3 between the opened position and the closed position. This makes it possible to perform opening and closing operation with one action, thereby enhancing operability.

Further, the device main body 2 and the display unit 3 can be prevented from being contacted (collided) because, after the slide plate 30 is moved to the second position, the device main body 2 and the display unit 3 are rotated while maintaining the state in which the corner portions P1 and P2 are separated.

Further, the display unit 3 that is to be opened and closed can be made compact and concurrently design of the display unit 3 can be enhanced because the cam portion 60 having a large shape relative to the locking pin 70 is provided in the device main body 2. Further, in this embodiment, a configuration is adopted such that the recess 4a is formed in the display unit accommodating portion 4 and a part of the cam portion 60 is located inside this recess 4a. Thus, the device main body 2 can be made thin, and the design of the device main body 2 can be enhanced.

Next, a modified example of the embodiment is explained.

Figure 6:
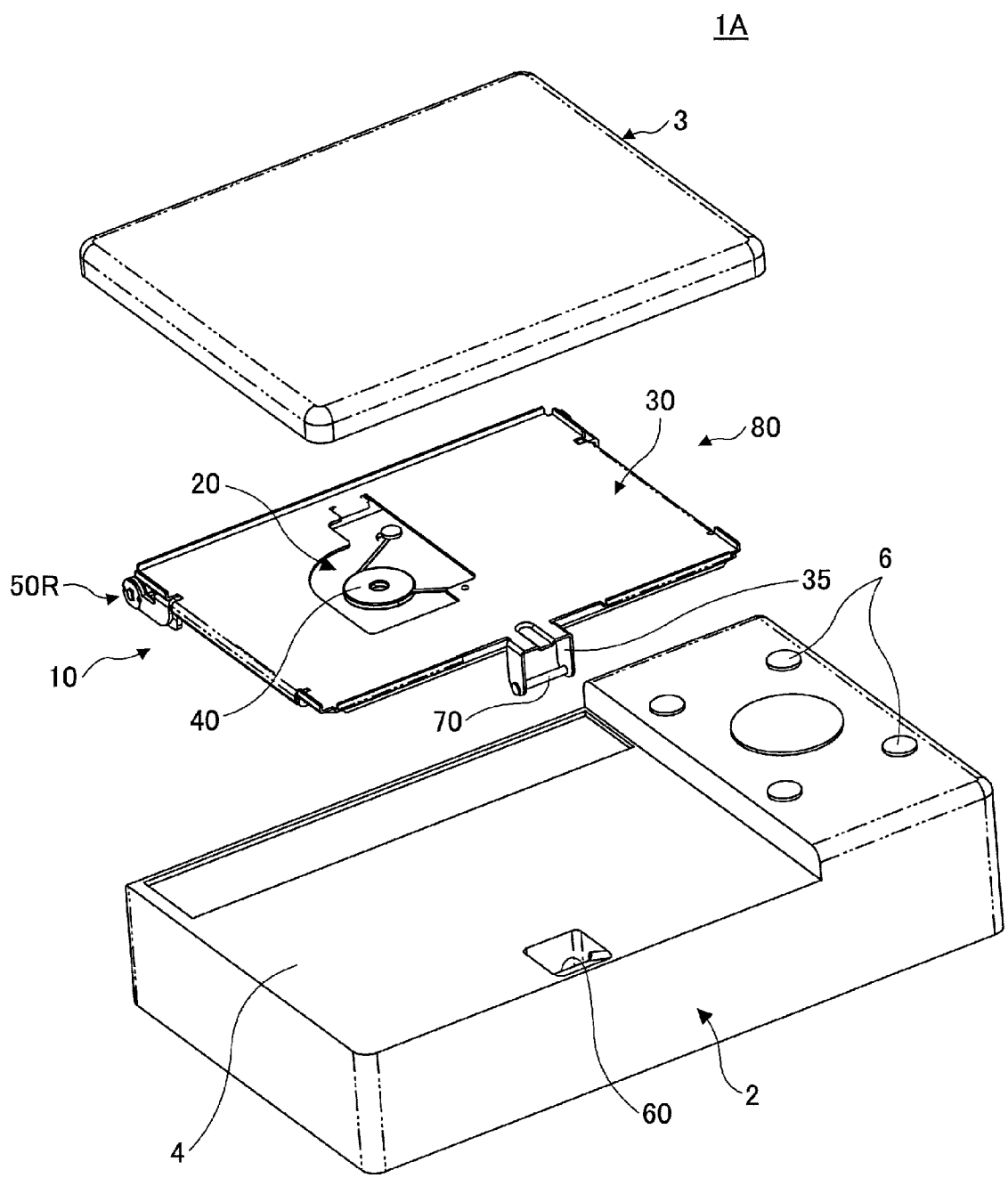
FIG. 6 is a perspective view showing an electronic device according to a modified example.

FIG. 6 shows an electronic device 1A that is a modified example of the electronic device 1 according to the above-described embodiment. Note that, in FIG. 6, the same reference numerals are attached to configurations corresponding to the configurations that are shown in FIGS. 1-6 that are used for the explanation of the above-described embodiment, and their explanations are omitted.

The electronic device 1 according to the above-described embodiment has a configuration such that the locking pin 70 is provided in the pin fixing portion 35 that is formed at the side edge of the base plate 20. Namely, a configuration is adopted such that the locking pin 70 is provided at the side part of the base plate 20. Further, the cam portion 60 is also disposed at one side edge part of the display unit accommodating portion 4, corresponding to the arrangement position of the locking pin 70.

In contrast, in the modified example, the locking pin 70 is disposed at a center position of a side edge of the long side of the slide plate 30. Specifically, between the long sides of the slide plate 30 that has a substantially rectangular shape, the locking pin 70 is disposed substantially at the center of the long side other than the long side at which the hinge systems 50L and 50R are provided.

The arrangement position of the locking pin 70 is not limited to the short side of the display unit 3, and the locking pin 70 can be provided at the long side of the display unit 3 as the modified example. Further, the arrangement position of the locking pin 70 on the long side is not limited to the center as in the case of the modified example, and the locking pin 70 can be disposed at a position that is shifted from the center, or the locking pins 70 may be disposed at a plurality of positions.

The preferred embodiment of the present invention is explained in detail above. However, the present invention is not limited to the specific embodiment described above, and various modifications and alterations can be made within the gist of the present invention that is set forth in the claims.

For example, in the above-described embodiment, the cam portion 60 is integrally formed in the device main body 2. However, the cam portion 60 may be integrally formed in the display unit 3. In such a configuration, the cam portion 60 can be integrally formed during resin molding of the display unit 3 because the display 3 is formed by resin molding. Thus, the number of the components can be reduced and the number of assembly steps can be reduced.

Further, for the case in which the cam portion 60 is integrally formed in the display unit 3, the locking pin 70 can be integrally formed in the device main body 2, or the locking pin 70 may be disposed at the stands 11L and/or 11R. For the case in which the locking pin 70 is integrally formed in the device main body 2, the locking pin 70 can be integrally formed during molding of the device main body 2 that is a resin molded product. Thus, the number of components can be reduced, and the number of assembly steps can be reduced.

This international application is based on and claims the benefit of priority of Japanese Patent Application No. 2014-092893 filed on Apr. 28, 2014, the entire contents of Japanese Patent Application No. 2014-092893 are hereby incorporated herein by reference.

EXPLANATION OF REFERENCE SIGNS

1: electronic device
2: device main body
3: display unit
4: display unit accommodating portion
5: liquid crystal display
10: opening and closing device
11L, 11R: stand
20: base plate
21: base main portion
30: slide plate
31: slide main portion
35: pin fixing portion
40: spring
50L, 50R: hinge system
51L, 50R: hinge pin
60: cam portion
61: cam main portion
62: locking recess
63: tilted surface
70: locking pin

The invention claimed is:

1. An electronic device including a first housing, a second housing, and an opening and closing device for opening and closing the second housing with respect to the first housing between a closed position and an opened position,
wherein the opening and closing device comprises:
a stand that is disposed in the first housing;
a base plate that is pivotably borne by the stand;
a movable plate that is disposed in the second housing and that is movably disposed in the base plate, wherein the movable plate is configured to move between a first position where the movable plate overlaps with the base plate and a second position where the movable plate protrudes from the base plate;
a bias unit configured to bias the movable plate to the base plate in the protruding direction;
a movement restriction system that is formed of a first member and a second member, wherein during a state in which the base plate is at the closed position, the movement restriction system is configured to restrict, by locking between the first member and the second member, movement of the base plate with respect to the stand and movement of the movable plate with respect to the base plate; and
a movement bias system configured to bias, during movement of the base plate from the opened position to the closed position, the movable plate to move from the second position toward the first position in accordance with the movement,
wherein the first member is integrally formed with one of the first housing and the second housing.

2. The electronic device according to claim 1,
wherein the first member is a cam-shaped member, and
wherein the second member is a pin-shaped member that is for locking with the cam-shaped member.

3. The electronic device according to claim 1,
wherein the first member is a cam-shaped member,
wherein the second member is a pin-shaped member that is for locking with the cam-shaped member, and
wherein the first member is disposed in the first housing.

4. The electronic device according to claim 1,
wherein the first member is a cam-shaped member,
wherein the second member is a pin-shaped member that is for locking with the cam-shaped member, and
wherein the second member is disposed in the movable plate.

5. An electronic device including a first housing, a second housing, and an opening and closing device for opening and closing the second housing with respect to the first housing between a closed position and an opened position,
the opening and closing device comprises:
a stand that is disposed in the first housing;
a base plate that is pivotably borne by the stand;
a movable plate that is disposed in the second housing and that is movably disposed in the base plate, wherein the movable plate is configured to move between a first position where the movable plate overlaps with the base plate and a second position where the movable plate protrudes from the base plate;
a bias unit configured to bias the movable plate to the base plate in the protruding direction;
a movement restriction system that is formed of a first member and a second member, wherein during a state in which the base plate is at the closed position, the movement restriction system is configured to restrict, by locking between the first member and the second member, movement of the base plate with respect to the stand and movement of the movable plate with respect to the base plate; and
a movement bias system configured to bias, during movement of the base plate from the opened position to the closed position, the movable plate to move from the second position toward the first position in accordance with the movement,
wherein the first member is integrally formed with the first housing, and the second member is integrally formed with the second housing.

6. The electronic device according to claim 5,
wherein one of the first member and the second member is a cam-shaped member, and
wherein the other of the first member and the second member is a pin-shaped member.

* * * * *